United States Patent
Tanaka et al.

(10) Patent No.: US 10,475,675 B2
(45) Date of Patent: Nov. 12, 2019

(54) MANUFACTURING APPARATUS AND MANUFACTURING METHOD OF SEMICONDUCTOR DEVICE

(71) Applicant: TOSHIBA MEMORY CORPORATION, Tokyo (JP)

(72) Inventors: Jun Tanaka, Kuwana Mie (JP); Masaya Shima, Oita Oita (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 182 days.

(21) Appl. No.: 15/133,978

(22) Filed: Apr. 20, 2016

(65) Prior Publication Data

US 2016/0314998 A1 Oct. 27, 2016

(30) Foreign Application Priority Data

Apr. 20, 2015 (JP) .................. 2015-086155

(51) Int. Cl.
*H01L 21/67* (2006.01)
*H01L 21/683* (2006.01)
*H01L 23/00* (2006.01)

(52) U.S. Cl.
CPC .. *H01L 21/67132* (2013.01); *H01L 21/67092* (2013.01); *H01L 21/67109* (2013.01);
(Continued)

(58) Field of Classification Search
CPC ....... H01L 21/67092; H01L 21/671132; H01L 21/67109; H01L 21/67115; H01L 21/6835; H01L 21/6836; H01L 21/78
See application file for complete search history.

(56) References Cited

U.S. PATENT DOCUMENTS 5,489,554 A * 2/1996 Gates ............... H01L 21/76898
257/E21.705
5,641,714 A * 6/1997 Yamanaka .......... H01L 21/6836
148/DIG. 28
(Continued)

FOREIGN PATENT DOCUMENTS

CN 1283874 A 2/2001
CN 101047146 A 10/2007
(Continued)

OTHER PUBLICATIONS

Taiwan Office Action dated Jul. 26, 2017, filed in Taiwan counterpart Application No. 105106349, 14 pages (with translation).
(Continued)

*Primary Examiner* — Dale E Page
*Assistant Examiner* — Quovaunda Jefferson
(74) *Attorney, Agent, or Firm* — Kim & Stewart LLP (57) ABSTRACT

An apparatus for manufacturing a semiconductor device includes a stage configured to hold tape adhering to a second surface of a semiconductor wafer having the second surface and a first surface opposite to the second surface, a vacuum mechanism attachable to an upper side of a substrate provided to adhere to the first surface, a driving unit configured to drive the vacuum mechanism in a direction by which the vacuum mechanism is separated from the substrate, and a cooling unit configured to cool the tape.

9 Claims, 10 Drawing Sheets

(52) U.S. Cl.
CPC .... *H01L 21/67115* (2013.01); *H01L 21/6835* (2013.01); *H01L 21/6836* (2013.01); *H01L 24/14* (2013.01); *H01L 2221/6834* (2013.01); *H01L 2221/6839* (2013.01); *H01L 2221/68327* (2013.01); *H01L 2221/68368* (2013.01); *H01L 2224/11* (2013.01); *H01L 2224/94* (2013.01)

(56) References Cited

U.S. PATENT DOCUMENTS

| | | |
|---|---|---|
| 6,452,091 B1 | 9/2002 | Nakagawa et al. |
| 2004/0137697 A1* | 7/2004 | Tomita ............... H01L 21/76259 438/455 |
| 2004/0192012 A1* | 9/2004 | Takezoe ............... H01L 21/6835 438/460 |
| 2006/0051935 A1* | 3/2006 | Silverbrook ........ B81C 1/00904 438/458 |
| 2007/0275543 A1* | 11/2007 | Abe ..................... H01L 21/78 438/464 |
| 2014/0150981 A1 | 6/2014 | Itou et al. |
| 2015/0101758 A1 | 4/2015 | Honda et al. |

FOREIGN PATENT DOCUMENTS

| | | |
|---|---|---|
| CN | 102646584 A | 8/2012 |
| JP | 2008306119 A | 12/2008 |
| JP | 2012-186447 A | 9/2012 |
| JP | 2013016579 A | 1/2013 |
| JP | 2013058529 A | 3/2013 |
| JP | 2014110388 A | 6/2014 |

OTHER PUBLICATIONS

Japanese Office Action dated Apr. 20, 2016, filed in Japanese counterpart Application No. 2015-086155, 8 pages (with translation).

* cited by examiner

MANUFACTURING APPARATUS AND MANUFACTURING METHOD OF SEMICONDUCTOR DEVICE

CROSS-REFERENCE TO RELATED APPLICATION

This application is based upon and claims the benefit of priority from Japanese Patent Application No. 2015-086155, filed Apr. 20, 2015, the entire contents of which are incorporated herein by reference.

FIELD

Embodiments described herein relate generally to a manufacturing apparatus and a method of manufacturing a semiconductor device.

BACKGROUND

In general, a semiconductor wafer is diced into individual semiconductor chips.

DETAILED DESCRIPTION

According to one embodiment, an apparatus for manufacturing a semiconductor device includes a stage configured to hold tape adhering to a second surface of a semiconductor wafer having the second surface and a first surface opposite to the second surface, a vacuum mechanism attachable to an upper side of a substrate provided to adhere to the first surface, a driving unit configured to drive the vacuum mechanism in a direction by which the vacuum mechanism is separated from the substrate, and a cooling unit configured to cool the tape.

First Embodiment

FIGS. 1 to 22 are views schematically illustrating an apparatus for manufacturing a semiconductor device and a method for manufacturing a semiconductor device according to a first embodiment.

Figure 1:
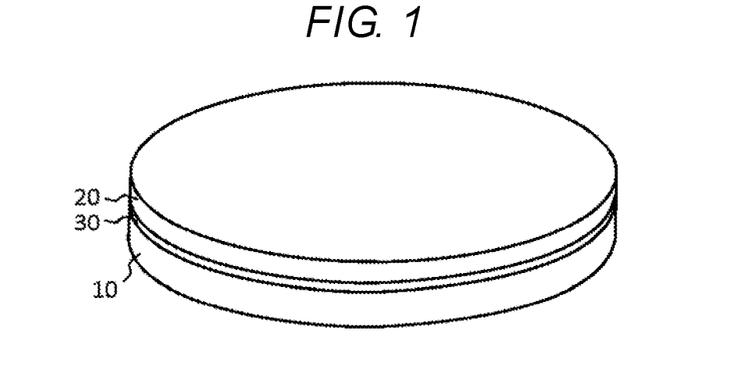
FIG. 1 is a perspective view schematically illustrating an apparatus for manufacturing a semiconductor device, which is used in a method for manufacturing a semiconductor device, according to a first embodiment.
Figure 2:
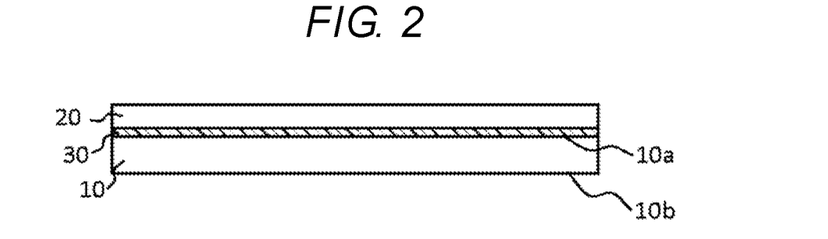
FIG. 2 is a sectional view of the apparatus for manufacturing the semiconductor device of FIG. 1, which is used in the method for manufacturing the semiconductor device, according to the first embodiment.

As illustrated in FIGS. 1 and 2, an adhesive layer 30 is provided on a first surface 10a side of a semiconductor wafer 10. A substrate 20 is provided on the adhesive layer 30. Further, as will be described hereinafter, an insulation layer 36 is located between the semiconductor wafer 10 and the adhesive layer 30; however, in FIGS. 1 and 2, the insulation layer 36 is not depicted.

The semiconductor wafer 10 has a first surface 10a and a second surface 10b. The first surface 10a is an element surface on which a NAND element, a transistor, a wiring, or the like, (not illustrated) is formed. The second surface 10b is the surface on the opposite side of the semiconductor wafer 10 from the first surface 10a.

The adhesive layer 30 is formed by being coated on, or affixed to, the first surface 10a side. The adhesive layer materials include an aromatic hydrocarbon resin, a thermoplastic resin, a silicone resin, or a thermoset resin, a stacked film of these resins, or the like. The adhesive layer 30 is, for example, about 30 μm to 60 μm in thickness. For the substrate 20, a semiconductor substrate or various other substrates are used. The substrate 20 is usually about 600 μm to 800 μm in thickness.

Figure 3:
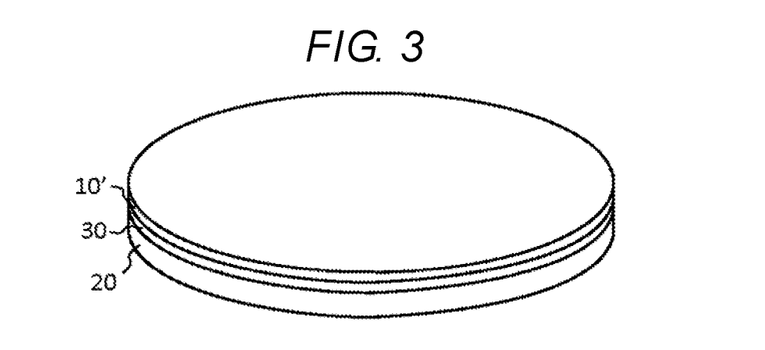
FIG. 3 is a perspective view schematically illustrating the apparatus for manufacturing the semiconductor device, which is used in the method for manufacturing the semiconductor device, according to the first embodiment.
Figure 4:
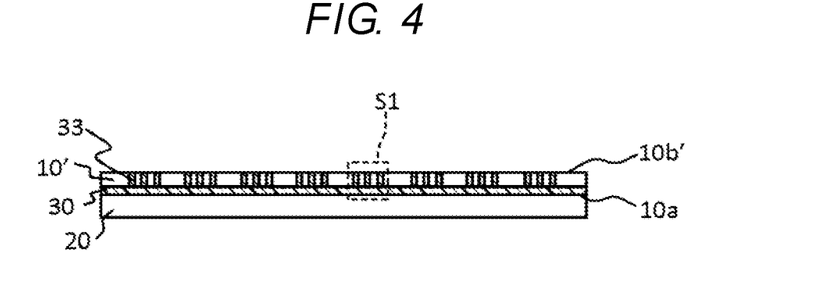
FIG. 4 is a sectional view schematically illustrating the apparatus for manufacturing the semiconductor device of FIG. 3, which is used in the method for manufacturing the semiconductor device, according to the first embodiment.

As illustrated in FIGS. 3 and 4, the semiconductor wafer 10, the adhesive layer 30, and the substrate 20 are turned upside down. Then, the second surface 10b is ground, thereby causing the semiconductor wafer 10 to be thinned. A second surface 10b' is formed after the second surface 10b is thinned. A semiconductor wafer 10', after being thinned, is usually 30 μm to 50 μm in thickness. Further, one or more contacts 33 are formed to extend through the semiconductor wafer 10 from the second surface 10b' to the first surface 10a.

Figure 5:
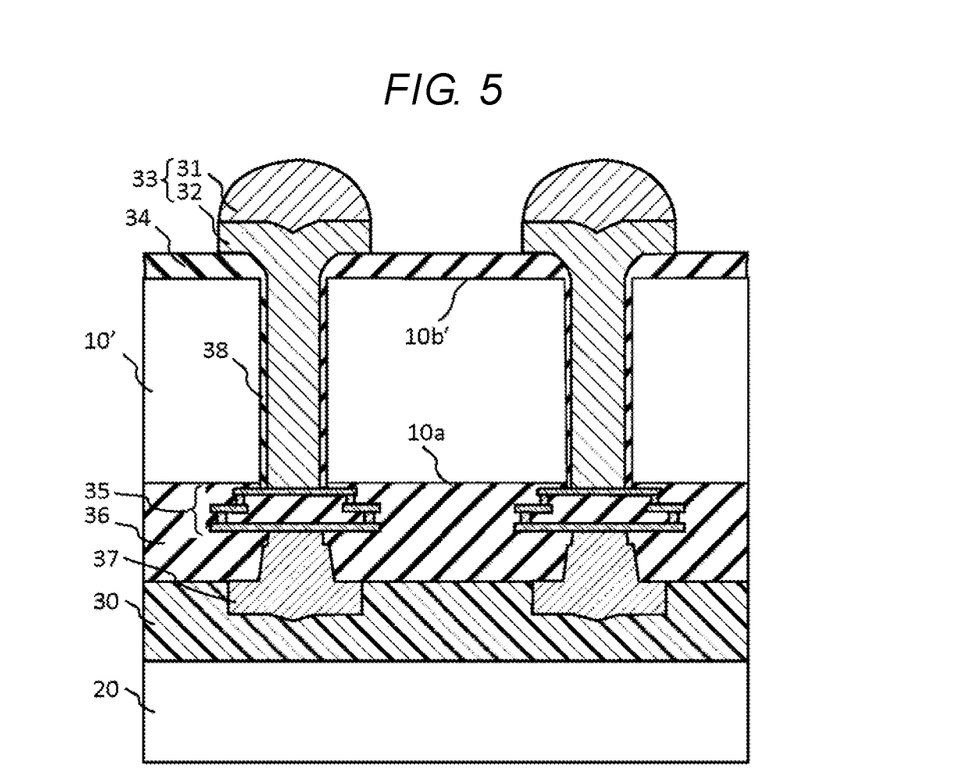
FIG. 5 is a schematic and enlarged sectional view of region S1 of FIG. 4.

FIG. 5 is an enlarged view of region S1 in FIG. 4 and it schematically shows an enlarged view of a contact 33.

The contact 33 includes a conductive layer 32 and a solder bump 31. The conductive layer 32 extends through the semiconductor wafer 10'. The conductive layer 32 is connected to a wiring layer 35 or the like which is provided on the first surface 10a of the semiconductor wafer 10' and is connected to the solder bump 31 provided on the second surface 10b'. The conductive layer 32 contains a plurality of conductive materials such as copper, nickel, titanium, or titanium nitride, or may be a stacked film of films made of these materials. The solder bump 31 is positioned on the conductive layer 32. Also, the solder bump 31 protrudes in a direction away from the second surface 10b'. In other words, the solder bump 31 includes a portion protruding from the second surface 10b', and having a convex shape.

The wiring layer 35 is disposed on the first surface 10a side of the semiconductor wafer 10'. The wiring layer 35 may include a plurality of wirings and a plurality of contacts. An insulation layer 36 is disposed on the second surface 10a and around the wiring layer 35. An electrode 37 is connected to the wiring layer 35 and extends away from the first surface 10a.

A method of forming the contact 33 is, for example, as follows.

The semiconductor wafer 10' and the insulation layer 36 are subjected to an etching process such that a contact hole 38 is formed by first forming a mask pattern, for example, using photolithography, followed by reactive ion etching (RIE) of the contact hole 38 through the semiconductor wafer 10 from the second side 10b'. The contact hole 38 is formed to reach, for example, the wiring layer 35. For example, tungsten, copper, or metal silicide is used in at least a portion of the wiring layer 35 which the contact hole 38 reaches. By using tungsten or metal silicide in the portion of the wiring layer to which the contact hole 38 extends, the selectivity of etching by RIE is easily increased with respect to the material of the semiconductor wafer 10. Accordingly, it is possible to form the contact hole 38 with accuracy. Subsequently, an insulation film 34 made of silicon oxide or the like is formed. If the insulation film 34 is formed to cover the wiring layer 35, the portion of the insulation film 34 that covers the wiring layer 35 is then removed such as by etching thereof.

Subsequently, the conductive layer 32 is formed by metal plating, by sputtering, or a combination thereof. The portion of the conductive layer 32 formed on insulation layer 34 is patterned, for example, using photolithography to form a patterned mask thereon followed by RIE. Subsequently, a solder layer is formed on the conductive layer 32. The solder layer is subjected to reflowing by heating, thereby forming the solder bump 31.

Figure 6:
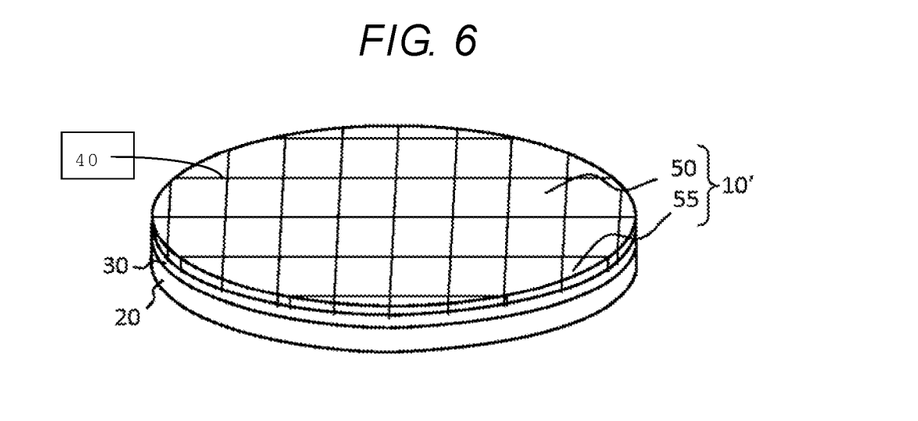
FIG. 6 is a perspective view schematically illustrating the apparatus for manufacturing the semiconductor device, which is used in the method for manufacturing the semiconductor according to the first embodiment, wherein grooves for dicing individual semiconductor chips from the apparatus have been provided in a semiconductor wafer.
Figure 7:
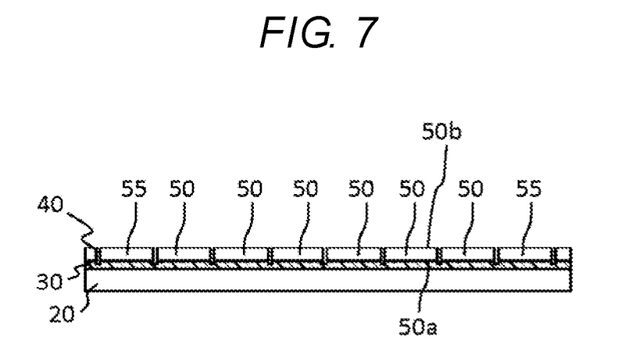
FIG. 7 is a sectional view of the apparatus for manufacturing the semiconductor device of FIG. 6, which is used in the method for manufacturing the semiconductor device according to the first embodiment.

As illustrated in FIGS. 6 and 7, grooves 40 are formed in the semiconductor wafer 10' and the semiconductor wafer is diced into a plurality of individual semiconductor chips 50 or defective chips 55. The semiconductor chips 50 are further processed to form a semiconductor device, and the defective chips 55 are not further processed to form a semiconductor device. To form the grooves 40, the semiconductor wafer 10' is subjected to a dicing process. The groove 40 is formed to extend inwardly from the second surface 10b' and through the semiconductor wafer 10 to reach the adhesive layer 30. Since the semiconductor chips 50 and the defective chips 55 are affixed to the adhesive layer 30, the chips are not yet separated. In the following description, a collective body of the plurality of semiconductor chips 50 and the defective chips 55 is referred to as a continuous semiconductor wafer 10', for convenience. Further, it is not necessary that the semiconductor wafer 10' is diced into pieces of the semiconductor chips 50 and the defective chips 55 at this stage of the manufacturing process thereof. In that case, the dicing may be performed prior to the picking-up which will be described hereinafter.

Figure 8:
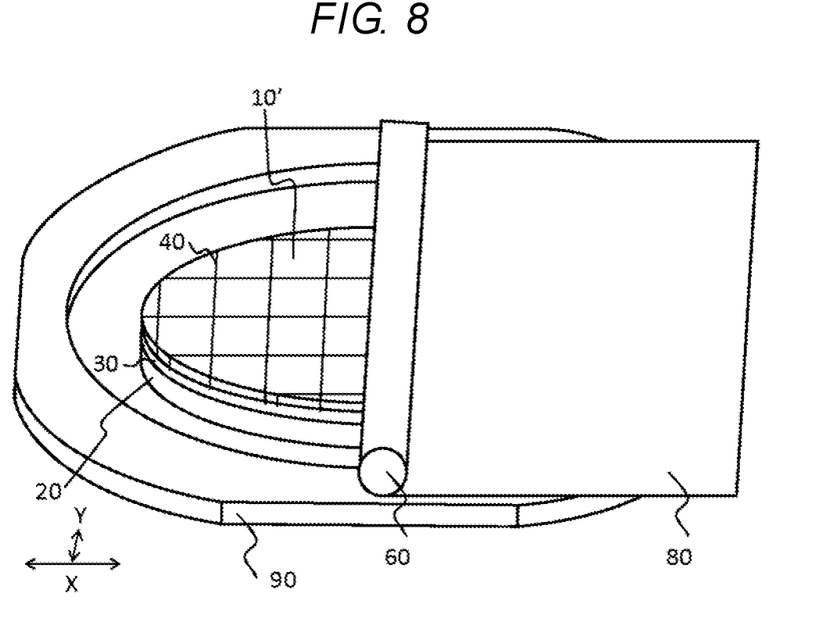
FIG. 8 is a perspective view schematically illustrating the apparatus for manufacturing the semiconductor device which is used in the method for manufacturing the semiconductor according to the first embodiment, wherein a support ring surrounds a grooved semiconductor wafer and an adhesive is applied over the grooved side of the semiconductor wafer.
Figure 9:
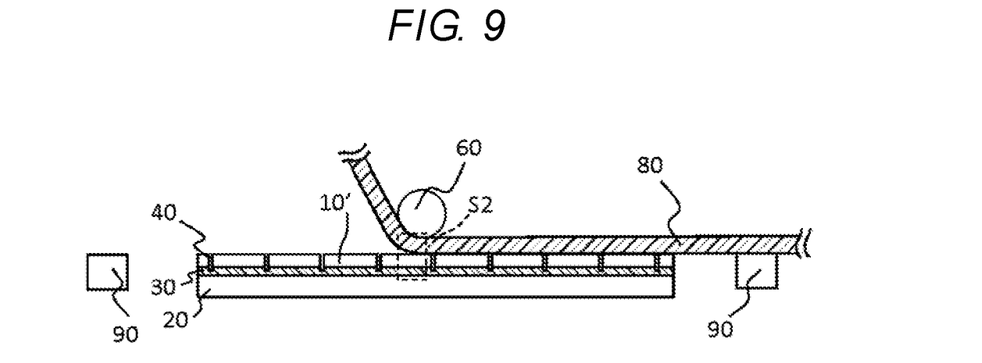
FIG. 9 is a sectional view of the apparatus for manufacturing the semiconductor device of FIG. 8, which is used in the method for manufacturing the semiconductor device, according to the first embodiment.

As illustrated in FIGS. 8 and 9, a first support ring 90 is disposed around the semiconductor wafer 10'. Also, first tape 80 is adhered to the second surface 10b' of the semiconductor wafer 10' and the first support ring 90 using a roller 60.

As the first tape 80 material, for example, a film of polyethylene terephthalate, polyolefin, an epoxy resin, polyimide, an acrylic resin, or a silicone resin, a stacked film of these films, or the like is used. The first tape 80 is usually 100 μm to 300 μm thick.

Figure 10:
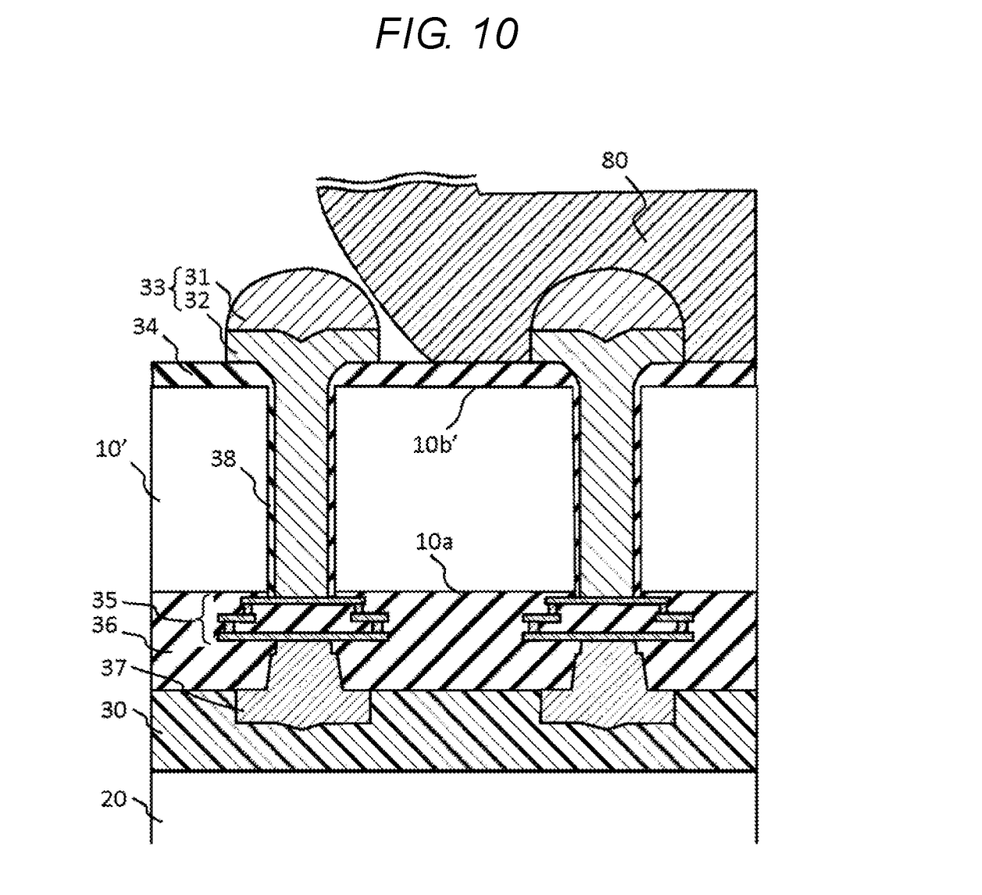
FIG. 10 is a schematic and enlarged sectional view of region S2 of FIG. 9.

FIG. 10 is an enlarged view of region S2 in FIG. 9 and an enlarged view of the vicinity of the contact 33 during affixing of the first tape 80 to the grooved surface of the continuous semiconductor wafer 10'.

As described above, the semiconductor wafer 10' includes the contact 33. As described above, the contact 33 has a convex shape extending from the second surface 10b', that is, it includes a protruding portion. If there are multiple voids between the first tape 80 and the second surface 10b' when the first tape 80 is affixed, there is a possibility that a chemical solution, or portions of the adhesive layer 30 dissolved in the chemical solution, will seep into and remain in the voids between the first tape 80 and the second surface 10b when chemical treatment is performed to remove the adhesive layer 30, as described hereinafter. In addition, if there are voids between the first tape 80 and the second surface 10b, the adhesive force between the first tape 80 and the semiconductor wafer 10 is decreased and there is a possibility that the continuous semiconductor wafer 10' or portions thereof will be removed from the first tape 80 in the process of removing the substrate 20 which will be described hereinafter. Therefore, it is desirable that the first tape 80 and the second surface 10b' are brought into close contact and affixed together with as few voids therebetween as possible.

When affixing is performed, the first tape 80 is affixed to the second surface 10b' with the first tape maintained under tension. Also, it is desirable that deformation of the first tape 80 is reduced in order for the first tape 80 to be affixed without voids. In other words, it is desirable that the first tape 80 have a low elastic modulus to enable it to conform with the topography of the processed surface of the continuous semiconductor wafer 10'.

Figure 11:
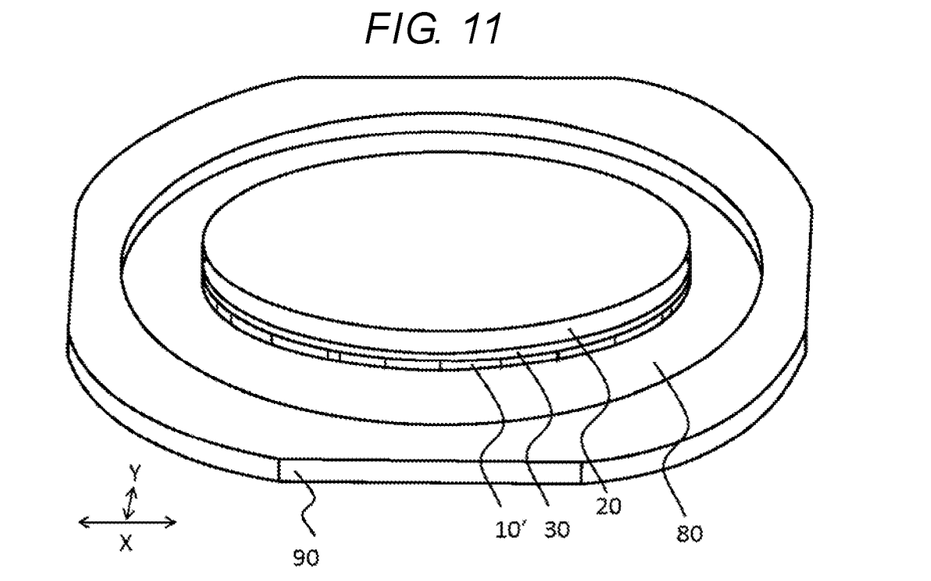
FIG. 11 is a perspective view schematically illustrating the apparatus for manufacturing the semiconductor device which is used in the method for manufacturing the semiconductor according to the first embodiment, reversed from the position thereof in FIG. 10.
Figure 12:
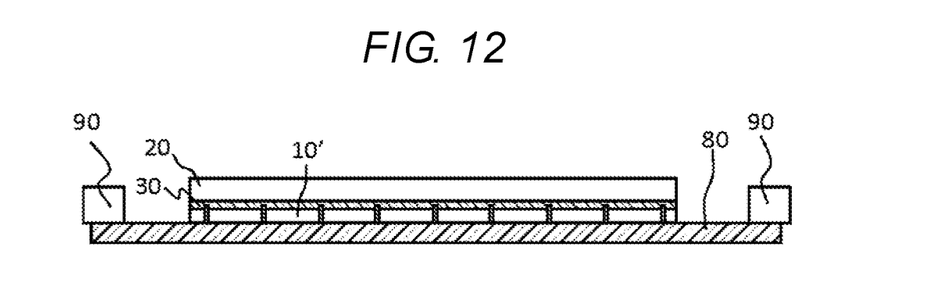
FIG. 12 is a sectional view of the apparatus for manufacturing the semiconductor device of FIG. 11, which is used in the method for manufacturing the semiconductor device, according to the first embodiment.

FIGS. 11 and 12 are views schematically illustrating a state in which the continuous semiconductor wafer 10', ring 90 and first tape 80 are turned upside down after the first tape 80 is affixed to the continuous semiconductor wafer 10'.

Figure 13:
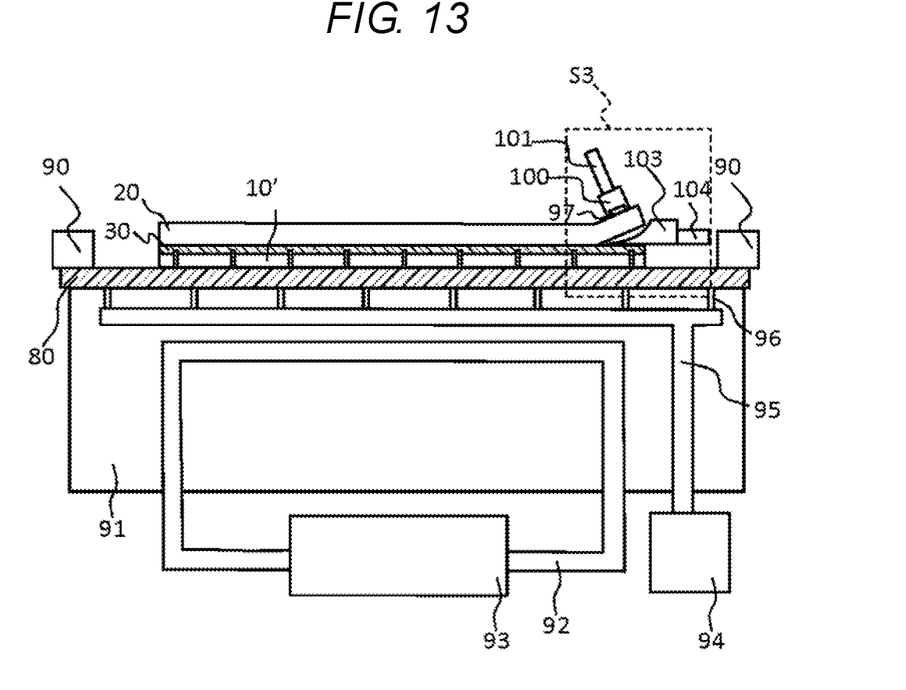
FIG. 13 is a sectional view schematically illustrating the apparatus for manufacturing the semiconductor device of FIG. 11, which used in the method for manufacturing the semiconductor device according to the first embodiment, showing the support substrate partially peeled therefrom.
Figure 14:
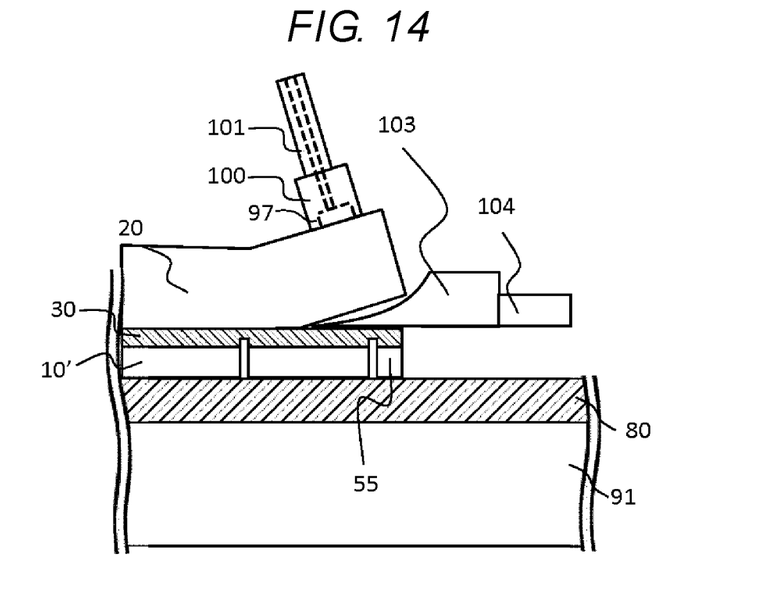
FIG. 14 is a schematic and enlarged sectional view of region S3 of FIG. 13.

As illustrated in FIGS. 13 and 14, the substrate 20 is then removed from the continuous semiconductor wafer 10'. FIG. 14 is an enlarged schematic view of region S3 in FIG. 13.

The first tape 80, the continuous semiconductor wafer 10', and the like are disposed on the stage 91. The stage 91 has one or more stage grooves 96 that are connected to, for example, a vacuum pump 94 through piping 95. The vacuum pump 94 performs suction from the stage groove 96 through the piping 95, whereby the first tape 80 and the like on the stage 91 are held by vacuum chucking thereof to the stage 91. In other words, the stage 91 has a holding mechanism. Also, the stage 91 holds the semiconductor wafer 10' and the adhesive layer 30 by holding the first tape 80.

The stage 91 has a cooling pipe 92 and is cooled with a refrigerant flowing through the cooling pipe 92. In this manner, the first tape 80 or the stage 91 are cooled, for example, within a range of from −15 degrees ° C. to 5 degrees ° C. or 10 degrees ° C. As described hereinafter, due to the cooling the first tape 80 is unlikely to be deformed or stretched. Specifically, the elastic modulus of the first tape 80 when cooled is 0.1 MPa or larger.

The cooling pipe 92 is disposed, for example, inside or below the stage 91. The cooling pipe 92 is connected to the cooling mechanism 93. The cooling mechanism 93 causes a refrigerant such as Freon to be compressed and to be liquefied. Subsequently, for example, the refrigerant is gasified in the cooling pipe 92, latent heat is generated, and the stage 91 is cooled.

Further, the cooling pipe 92 and the cooling mechanism 93 described above are an example and it is possible to use any cooling mechanism. For example, cooling may be directly performed in the cooling mechanism 93 without the cooling pipe 92. Another refrigerant different from the refrigerant used inside the cooling mechanism 93 may flow through the cooling pipe 92. The refrigerant is not limited to Freon, any refrigerant may be used. For example, an alternative to a chlorofluorocarbon or the like may be used. In addition, a cooling method, in which a Peltier element is used without a refrigerant, may be employed.

The substrate 20 is removed as follows, in a state in which the first tape 80 is cooled.

A removing unit 100 including an attachment mechanism 97 attaches to the top surface of the substrate 20. The attachment mechanism 97 includes a groove and a hole which are connected to, for example, the vacuum pump with vacuum or the like. The removing unit 100 is movable in a predetermined direction by a second driving unit 101 including a motor or the like. The removing unit 100 lifts the substrate 20 to remove the substrate 20 from the adhesive layer 30, while leaving all or a portion of the adhesive layer 30 between the substrate 20 and the semiconductor wafer 10'. In other words, the removing unit 100 removes the substrate 20 by increasing the distance between the substrate 20 and the stage 91.

Further, a jig 103, which is provided with a fine or thin front end portion, is inserted at the boundary between the substrate 20 and the adhesive layer 30. The jig 103 is movable along the adhesive layer 30 by a first driving unit 104 including a motor or the like.

The jig 103 is inserted and the substrate 20 is removed from the adhesive layer 30. In other words, at least the front end portion of the jig 103 applies an upward force to the substrate 20. The substrate 20 is gradually removed from the adhesive layer 30. In other words, the jig 103 removes the substrate 20 by widening a distance between the substrate 20 and the stage 91. Further, the jig 103 may cut the adhesive layer 30 extending between the substrate 20 and the semiconductor wafer 10'.

In addition, a portion of the adhesive layer 30 may adhere to the rear surface of the substrate 20. Further, both the first driving unit 104 and the second driving unit 101 may include a plurality of motors.

Figure 15:
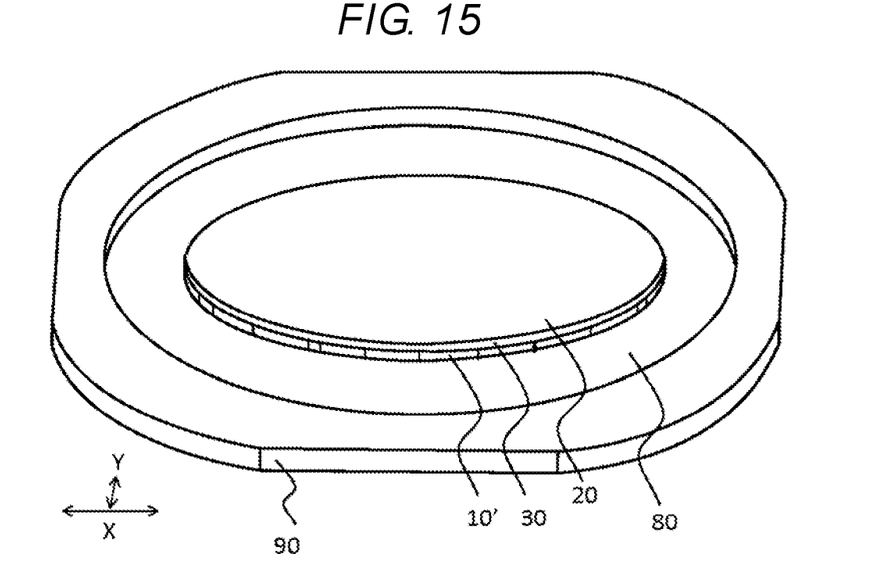
FIG. 15 is a perspective view schematically illustrating the apparatus for manufacturing the semiconductor device, which is used in the method for manufacturing the semiconductor device according to the first embodiment, showing the support substrate removed therefrom.
Figure 16:
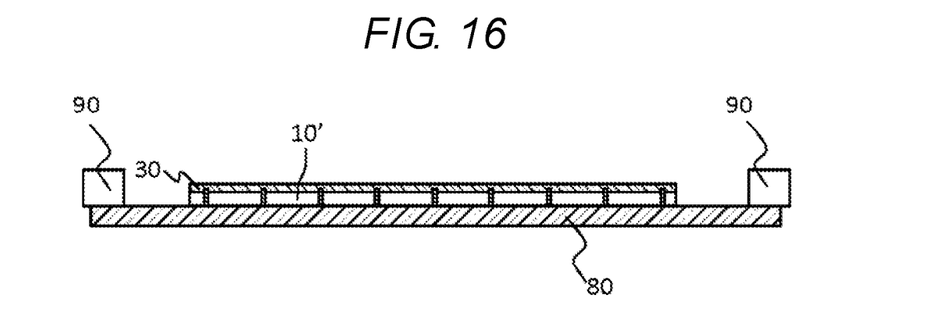
FIG. 16 is a sectional view of the apparatus for manufacturing the semiconductor device of FIG. 15, which is used in the method for manufacturing the semiconductor according to the first embodiment.

FIGS. 15 and 16 are views schematically illustrating a state in which the substrate 20 has been removed.

Figure 17:
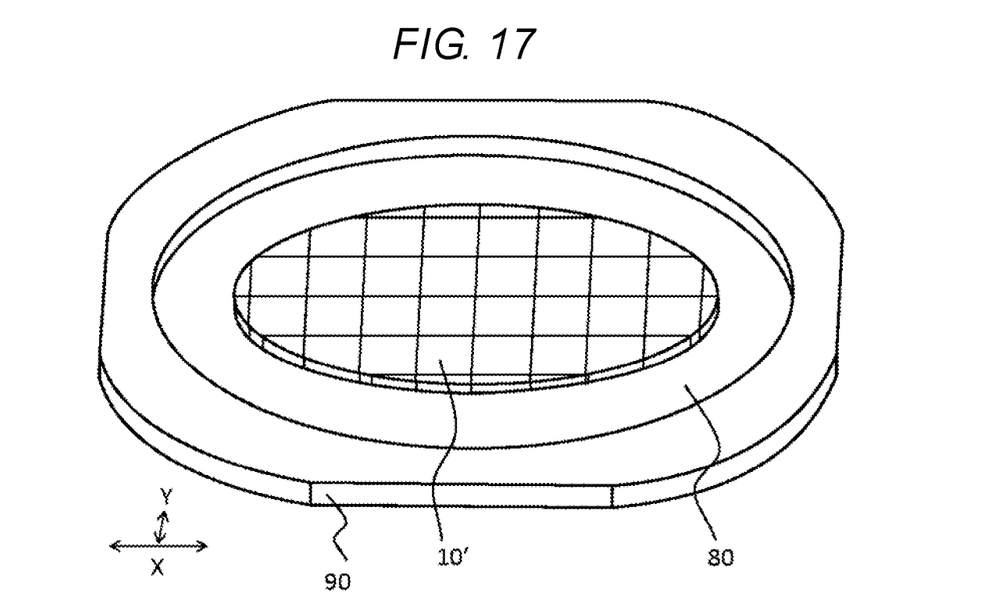
FIG. 17 is a perspective view schematically illustrating the apparatus for manufacturing the semiconductor device, which is used in the method for manufacturing the semiconductor according to the first embodiment, with the adhesive layer removed therefrom.
Figure 18:
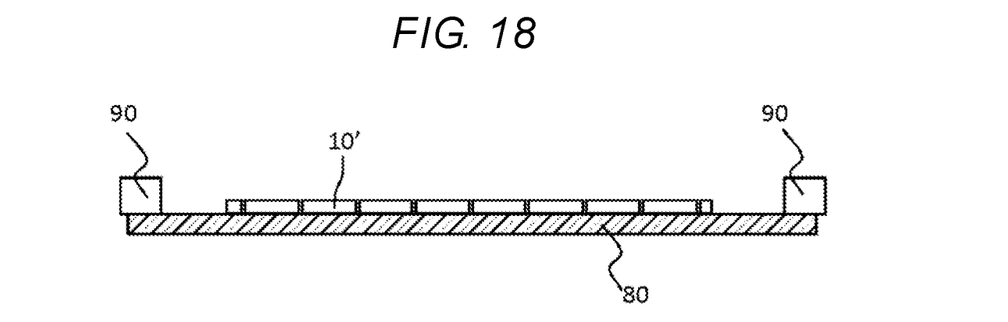
FIG. 18 is a sectional view of the apparatus for manufacturing the semiconductor device shown in FIG. 17, which is used in the method for manufacturing the semiconductor according to the first embodiment.

As illustrated in FIGS. 17 and 18, the adhesive layer 30 has been removed by a solvent or the like. The adhesive layer 30 is removed, for example, by chemical treatment. As described above, there is a possibility that a chemical solution or the adhesive layer 30 dissolved in the chemical solution will remain in the voids between the first tape and the second surface 10b when chemical solution is used to remove the adhesive layer 30. Therefore, it is desirable that the first tape 80 and the second surface 10b' are brought into close contact and affixed with as few voids therebetween as possible.

Figure 19:
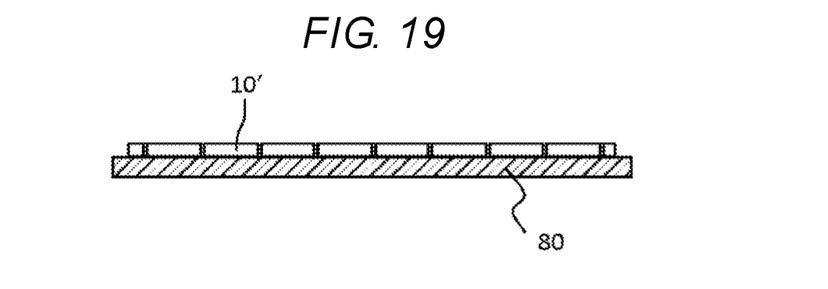
FIG. 19 is a sectional view of the apparatus for manufacturing the semiconductor device of shown in FIG. 17, which is used in the method for manufacturing the semiconductor according to the first embodiment, with the support ring removed therefrom.

As illustrated in FIG. 19, the first tape 80 has been cut in the region between the semiconductor wafer 10' and the first support ring 90. The cut part of the first tape 80 connected to the first support ring 90, and the first support ring 90, are then removed.

Figure 20:
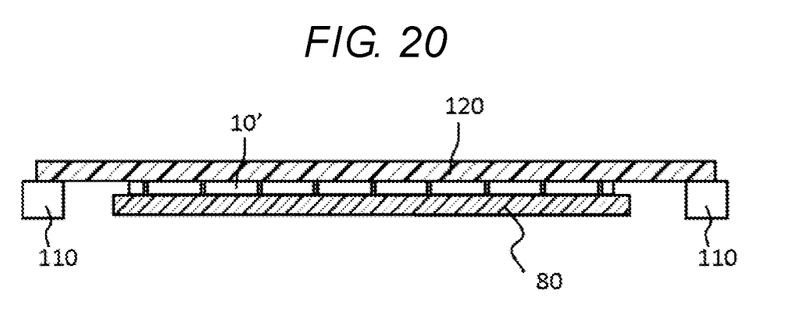
FIG. 20 is a sectional view schematically illustrating the apparatus for manufacturing the semiconductor device, which is used in the method for manufacturing the semiconductor according to the first embodiment, wherein a second tape is adhered to the semiconductor wafer and a second support ring surrounds the semiconductor wafer and is likewise adhered to the second tape.

As illustrated in FIG. 20, the semiconductor wafer 10' and the like are then turned upside down. A second support ring 110 is then provided to surround the semiconductor wafer 10'. The second tape 120 adheres to the top surface of the semiconductor wafer 10' and to the second support ring 110.

Figure 21:
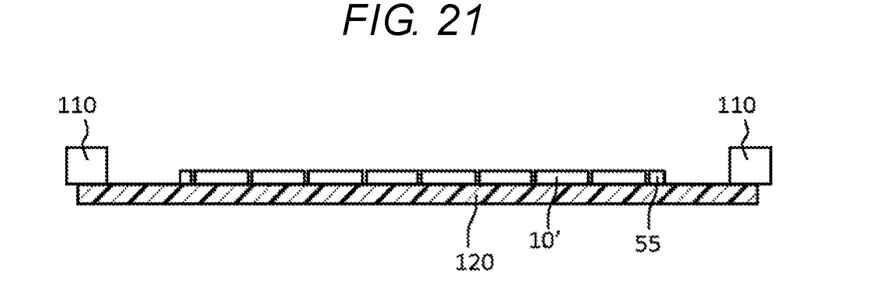
FIG. 21 is a sectional view schematically illustrating the apparatus for manufacturing the semiconductor device, which is used in the method for manufacturing the semiconductor according to the first embodiment, wherein the first tape has been removed.

As illustrated in FIG. 21, the semiconductor wafer 10' and the like are turned upside down. Then, the first tape 80 is removed. The semiconductor wafer 10' is affixed to the second support ring 110 through the second tape 120. Therefore, it is possible to remove the first tape 80.

Figure 22:
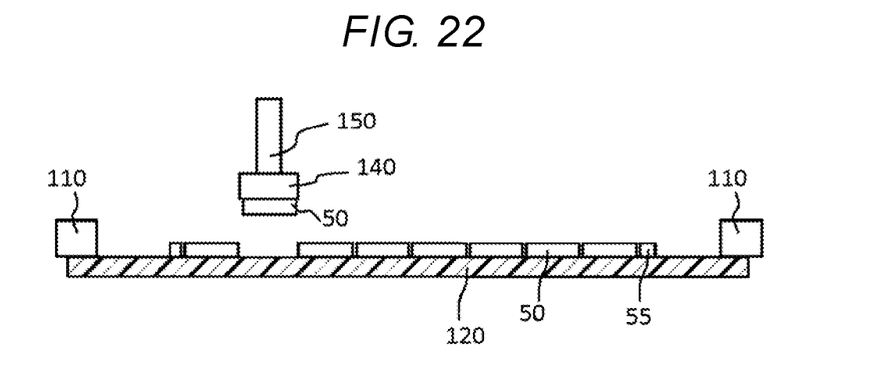
FIG. 22 is a sectional view schematically illustrating the apparatus for manufacturing the semiconductor device, which is used in the method for manufacturing the semiconductor according to the first embodiment, showing an individual chip being removed from the second tape.

As illustrated in FIG. 22, the semiconductor chip 50 is picked up or lifted from the semiconductor wafer 10', for example, by a picking-up mechanism 150 including an attachment collet 140, and is transported to a further predetermined manufacturing process of the semiconductor device such as a mounting process to a substrate or another semiconductor chip(s). Further, when the semiconductor wafer 10' is not previously diced into the semiconductor chips, the wafer may be diced into pieces of semiconductor chips according to any method such as polishing or expanding, or by dicing before picking up.

Regarding Effects of the Embodiment

According to the embodiment, the stage that supports the first tape 80 at least during the removing of the substrate 20 from the continuous semiconductor wafer 10' is cooled in a range of from −15 degrees ° C. to 5 degrees ° C. or 10 degrees ° C., whereby the substrate 20 is removed. Particularly, it is more desirable that the stage is in a state in which the stage is cooled to 5 degrees ° C. or less. The first tape 80 is cooled which increases the elastic modulus thereof, thereby making it possible to easily remove the substrate 20.

As described in FIG. 14, the upwardly directed force from the removing unit 100 and the jig 103 is applied to the substrate 20. The upwardly directed force is also applied to the first tape 80 through the adhesive layer 30 and the continuous semiconductor wafer 10' which adhere to the substrate 20.

Here, a case where the first tape 80 is likely to stretch is studied as a comparative example. When the first tape 80 stretches during the application of the upward force, the upward force applied between the substrate 20 and the adhesive layer 30, or within the adhesive layer 30, is decreased when the first tape 80 stretches. In other words, of the force applied to the substrate 20, the portion of that force applied between the substrate 20 and the adhesive layer 30 is decreased.

In comparison, according to the embodiment, the first tape 80 is cooled, for example, to 10 degrees or less or to 5 degrees or less. Due to the cooling, the first tape 80 is unlikely to stretch when the substrate 20 is pulled upwardly. In other words, the force applied to the substrate 20 is also sufficiently applied between the substrate 20 and the adhesive layer 30.

Particularly, the adhesive layer 30 is 30 μm to 50 μm in thickness and the continuous semiconductor wafer 10' is 30 μm to 50 μm in thickness; in comparison, the first tape 80 is 100 μm to 200 μm in thickness. In other words, the thickness of the first tape 80 is greater than the thickness of the adhesive layer 30, and further is greater than the sum of the thickness of the adhesive layer 30 and the thickness of the semiconductor chip 50. A resultant elastic modulus of the composite structure including the adhesive layer 30, the semiconductor wafer 10 and the first tape 80 is close to the elastic modulus of the first tape 80 and far from the elastic modulus of the semiconductor wafer 10'. Accordingly, the elastic modulus described above is improved, thereby increasing effects of suppressing the stretching of the first tape 80.

Figure 23:
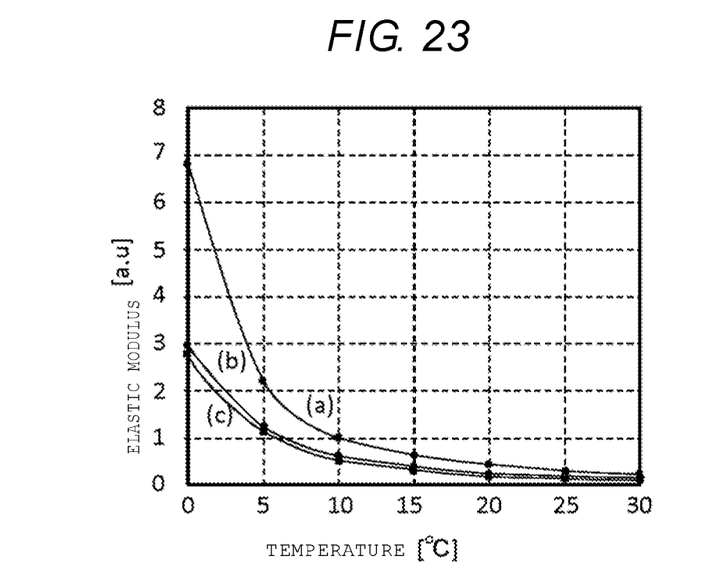
FIG. 23 is a graph showing a relationship between the temperature of a stage with which the first tape comes into contact and the elastic modulus of the first tape.

FIG. 23 is a graph showing a relationship between the temperature and the elastic modulus of three types of first tapes 80, each containing a different carbon number of acryl and depicted as (a), (b), and (c), respectively. The carbon number of acryl is selected so that a transition temperature of the first tape 80 (i.e., the temperature below which a significant increase in the elastic modulus of the first tape is observed) is between the temperature at which steps depicted in FIGS. 8, 9, and 10 are carried out and the temperature at which the steps depicted in FIGS. 13 and 14 are carried out. In FIG. 23, the horizontal axis represents the temperature of the stage which is in contact with the first tape 80 and the vertical axis represents the elastic modulus of the first tape 80. As illustrated in FIG. 23, if the first tape 80 is made of the material described above, the elastic modulus thereof is increased at a temperature of 10 degrees ° C. or less. In particular, the elastic modulus is increased at a temperature of 5 degrees ° C. or less. The large elastic modulus of the first tape 80 means that the first tape 80 is unlikely to stretch during removal of the substrate 20. In other words, according to the embodiment, it is possible to easily remove the substrate 20 from the adhesive layer 30. Further, the first tape 80 may be made of not only the materials described above, but also similar materials of which the elastic modulus is increased at a temperature of 10 degrees ° C. or less.

Further, according to the embodiment, when the first tape 80 is adhered to the continuous semiconductor wafer 10', the elastic modulus of the first tape 80 is low. Therefore, it is easy to perform adhesion of the first tape 80 to the semiconductor wafer 10 with few voids therebetween, regardless of a step or raised area on the continuous semiconductor wafer 10' created by the solder bumps 31 located on the contact 33 provided in the semiconductor chips 50 to be singulated from the semiconductor wafer 10.

When there are voids between the first tape 80 and the continuous semiconductor wafer 10', there is a possibility that the voids will be filled with the chemical solution used when the adhesive layer 30 is removed. In other words, there is a possibility that the first tape 80 will be removed by the chemical solution used in removing the adhesive layer 30. According to the present embodiment, it is possible to also avoid such defects.

Second Embodiment

In a second embodiment, the elastic modulus of the first tape is increased in a different way from that in the first embodiment. In other words, in the second embodiment, the first tape 80 is irradiated with ultraviolet (light), thereby increasing the elastic modulus thereof.

Figure 24:
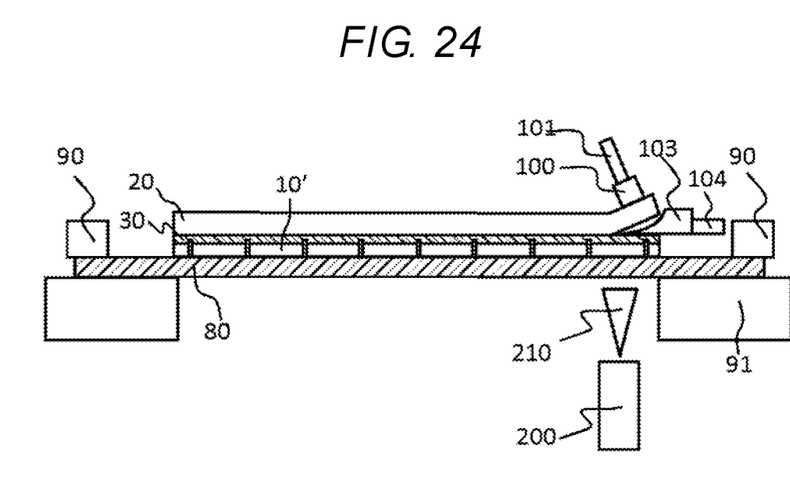
FIG. 24 is a sectional view schematically illustrating an apparatus for manufacturing a semiconductor device which is used in a method for manufacturing a semiconductor according to a second embodiment.

As illustrated in FIG. 24, the first tape 80 is irradiated with ultraviolet energy 210 from an ultraviolet energy irradiating device 200. The irradiation by the ultraviolet energy 210 causes the first tape 80 to have a large elastic modulus.

The ultraviolet irradiating device 200 performs irradiation from below the first tape 80, that is, from the side opposite to the removing unit 100. The ultraviolet irradiating device 200 is, for example, a halogen lamp, a mercury lamp, or the like.

Further, in the embodiment, ultraviolet light energy is described as an example; however, the embodiment is not limited thereto, and visible light or infrared light may be used as long as the elastic modulus of the first tape 80 is increased thereby.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for manufacturing a semiconductor device comprising:
    forming a wiring layer on a first surface of a semiconductor wafer having the first surface and a second surface facing away from the first surface;
    forming an insulation layer covering the wiring layer on the first surface of the semiconductor wafer;
    bonding a substrate on the insulation layer with an adhesive layer between the insulation layer and the substrate;
    forming a contact extending through the semiconductor wafer, the contact comprising a convex portion adjacent to the second surface;
    affixing tape on the second surface of the semiconductor wafer;
    increasing the elastic modulus of the tape; and
    separating the substrate from the first surface of the semiconductor wafer after increasing the elastic modulus of the tape, wherein
    the contact is electrically connected to the wiring layer.

2. The method according to claim 1,
    wherein the thickness of the tape is greater than a sum of the thickness of the semiconductor wafer and the thickness of the adhesive layer.

3. The method according to claim 1, further comprising:
    positioning a surface of the tape against a stage configured to hold the tape.

4. The method according to claim 3, further comprising:
    cooling the stage to a temperature in the range of from −15 degrees ° C. to 10 degrees ° C., wherein
    the elastic modulus of the tape is increased when the tape is cooled by cooling the stage.

5. The method according to claim 1,
    wherein the elastic modulus of the tape is increased by irradiating the tape with ultraviolet light.

6. The method according to claim 1, wherein the elastic modulus of the tape is increased by 0.1 MPa or larger.

7. The method according to claim 1, further comprising:
    positioning a vacuum mechanism onto an upper side of the substrate; and
    inserting a jig comprising a front end portion between the substrate and the semiconductor wafer during the separation of the substrate from the semiconductor wafer.

8. The method according to claim 1, wherein the tape comprises a material having an elastic modulus that varies in accordance with a temperature thereof.

9. The method according to claim 1, further comprising grinding the surface of the semiconductor wafer before the separation of the substrate from the semiconductor wafer.

* * * * *